(12) United States Patent
Kung

(10) Patent No.: US 9,831,697 B2
(45) Date of Patent: Nov. 28, 2017

(54) APPARATUS FOR PERFORMING MULTI-LOOP POWER CONTROL IN AN ELECTRONIC DEVICE WITH AID OF ANALOG COMPENSATION AND DUTY CYCLE SELECTION, AND ASSOCIATED METHOD

(71) Applicant: MEDIATEK INC., Hsin-Chu (TW)

(72) Inventor: Nien-Hui Kung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 94 days.

(21) Appl. No.: 14/923,403

(22) Filed: Oct. 26, 2015

(65) Prior Publication Data

US 2016/0336778 A1 Nov. 17, 2016

Related U.S. Application Data

(60) Provisional application No. 62/161,886, filed on May 15, 2015.

(51) Int. Cl.
*H02J 7/04* (2006.01)
*H02J 7/00* (2006.01)
(Continued)

(52) U.S. Cl.
CPC .......... *H02J 7/0052* (2013.01); *H02J 7/0065* (2013.01); *H02M 3/158* (2013.01); *H03F 3/45179* (2013.01); *H04B 1/3827* (2013.01); *H02J 7/007* (2013.01); *H03F 2200/351* (2013.01); *H03F 2200/471* (2013.01); *H03F 2203/45116* (2013.01); *H03K 7/08* (2013.01)

(58) Field of Classification Search
CPC ........ H02J 7/0052; H02J 7/0065; H02J 7/007; H02M 3/158
USPC .......................................................... 320/162
See application file for complete search history.

(56) References Cited

U.S. PATENT DOCUMENTS

| 6,166,521 A | 12/2000 | Mercer |
| 7,683,574 B2 * | 3/2010 | Guang .................. H02J 7/0077 320/121 |

(Continued)

FOREIGN PATENT DOCUMENTS

| CN | 103066666 A | 4/2013 |
| EP | 1 049 229 A1 | 11/2000 |

(Continued)

*Primary Examiner* — M'Baye Diao
(74) *Attorney, Agent, or Firm* — Winston Hsu

(57) ABSTRACT

An apparatus for performing multi-loop power control in an electronic device is provided, where the apparatus may include at least one portion (e.g. a portion or all) of the electronic device. More particularly, the apparatus may include a first amplifier that is positioned in a first feedback loop of the electronic device and coupled to a power control terminal of the electronic device, and a second amplifier that is positioned in a second feedback loop of the electronic device and coupled to the power control terminal. For example, the apparatus may further include a compensation circuit that is coupled to the first amplifier and the second amplifier. In another example, the apparatus may further include a selection control circuit that is coupled to the first amplifier and the second amplifier. An associated method such as an operational method of the above apparatus is also provided.

20 Claims, 10 Drawing Sheets

(51) Int. Cl.
*H02M 3/158* (2006.01)
*H03F 3/45* (2006.01)
*H04B 1/3827* (2015.01)
*H03K 7/08* (2006.01)

(56) References Cited

U.S. PATENT DOCUMENTS

| | | | | |
|---|---|---|---|---|
| 8,344,717 | B2 * | 1/2013 | Philbrick | H02M 3/156 |
| | | | | 323/282 |
| 9,276,477 | B2 * | 3/2016 | Thomas | H02M 3/1588 |
| 2006/0114624 | A1 | 6/2006 | Sharma | |
| 2013/0181522 | A1 * | 7/2013 | Wang | H02J 7/0022 |
| | | | | 307/33 |
| 2014/0184173 | A1 | 7/2014 | Szepesi | |
| 2014/0203763 | A1 | 7/2014 | Zhao | |
| 2015/0069956 | A1 | 3/2015 | Hu | |
| 2015/0364989 | A1 * | 12/2015 | Chung | H02M 1/12 |
| | | | | 363/44 |

FOREIGN PATENT DOCUMENTS

| | | | |
|---|---|---|---|
| EP | 1049229 | A1 | 11/2000 |
| EP | 2 466 738 | A1 | 6/2012 |

\* cited by examiner

APPARATUS FOR PERFORMING MULTI-LOOP POWER CONTROL IN AN ELECTRONIC DEVICE WITH AID OF ANALOG COMPENSATION AND DUTY CYCLE SELECTION, AND ASSOCIATED METHOD

CROSS REFERENCE TO RELATED APPLICATIONS

This application claims the benefit of U.S. Provisional Application No. 62/161,886, which was filed on May 15, 2015, and is included herein by reference.

BACKGROUND

The present invention relates to charger control in a portable electronic device, and more particularly, to an apparatus for performing multi-loop power control in an electronic device, and an associated method.

FIG. 1 illustrates an overlap effect from an overlap between activation time periods of multiple feedback loops of a conventional charger system according to the related art, where the horizontal axis represents the charging time, and the vertical axis represents the charging current. As shown in FIG. 1, when switching from a constant current (CC) phase (labeled "CC" in FIG. 1 for brevity) to a constant voltage (CV) phase (labeled "CV" in FIG. 1 for brevity), it is hard for the conventional charger system to prevent these multiple feedback loops from being active at the same time. As a result, one of these multiple feedback loops may affect another of these multiple feedback loops, and there are two transitions in the curve shown in FIG. 1, rather than a single transition corresponding to a sharp boundary at the transition time point. In addition, the charging time of the conventional charger system is enlarged due to this overlap effect.

FIG. 2 illustrates another overlap effect from an overlap between activation time periods of multiple feedback loops of a conventional charger system according to the related art, where the horizontal axis represents the charging time, and the vertical axis represents the charging current. As shown in FIG. 2, when switching from an IBAT phase (labeled "IBAT" in FIG. 2 for brevity) to an ICL phase (labeled "ICL" in FIG. 2 for brevity), it is hard for the conventional charger system to prevent these multiple feedback loops from being active at the same time. As a result, one of these multiple feedback loops may affect another of these multiple feedback loops, and some charging characteristics of the conventional charger system are degraded. In addition, the charging time of the conventional charger system is enlarged due to this overlap effect.

In conclusion, there are many problems in the conventional charger systems, and each of the conventional charger systems cannot guarantee high stability in each of various situations. Thus, a novel architecture is required to reduce (e.g. to remove) the overlap effects, in order to guarantee the overall performance of the whole system.

SUMMARY

It is an objective of the claimed invention to provide an apparatus for performing multi-loop power control in an electronic device, and an associated method, in order to solve the above-mentioned problems.

It is another objective of the claimed invention to provide an apparatus for performing multi-loop power control in an electronic device, and an associated method, in order to keep high stability of the electronic device in each of various situations.

It is another objective of the claimed invention to provide an apparatus for performing multi-loop power control in an electronic device, and an associated method, in order to reduce the charging time of a charger within the electronic device.

According to at least one preferred embodiment, an apparatus for performing multi-loop power control in an electronic device is provided, where the apparatus may comprise at least one portion (e.g. a portion or all) of the electronic device. For example, the apparatus may comprise a first amplifier that is positioned in a first feedback loop of the electronic device and coupled to a power control terminal of the electronic device, a second amplifier that is positioned in a second feedback loop of the electronic device and coupled to the power control terminal, and a compensation circuit that is coupled to the first amplifier and the second amplifier. The first amplifier is arranged for selectively outputting a first error signal toward the power control terminal. In addition, the second amplifier is arranged for selectively outputting a second error signal toward the power control terminal. Additionally, the compensation circuit is arranged for detecting the first error signal to generate a compensation signal corresponding to the first error signal and applying the compensation signal to the second error signal, to perform power control of the electronic device.

According to at least one preferred embodiment, a method for performing multi-loop power control in an electronic device, such as an operational method of the above apparatus, is provided. For example, this method such as the operational method of the above apparatus may comprise: utilizing the first amplifier to selectively output the first error signal toward the power control terminal; utilizing the second amplifier to selectively output the second error signal toward the power control terminal; and applying the compensation signal corresponding to the first error signal to the second error signal, to perform power control of the electronic device.

According to at least one preferred embodiment, an apparatus for performing multi-loop power control in an electronic device is also provided, where the apparatus may comprise at least one portion (e.g. a portion or all) of the electronic device. For example, the apparatus may comprise a first amplifier that is positioned in a first feedback loop of the electronic device, a second amplifier that is positioned in a second feedback loop of the electronic device, and a selection control circuit that is coupled to the first amplifier and the second amplifier. The first amplifier is arranged for selectively outputting a first error signal. In addition, the second amplifier is arranged for selectively outputting a second error signal. Additionally, the selection control circuit is arranged for detecting a first pulse width modulation (PWM) signal corresponding to the first error signal and a second PWM signal corresponding to the second error signal to generate at least one detection result, and dynamically selecting one of the first PWM signal and the second PWM signal as a resultant PWM signal according to the at least one detection result, to perform power control of the electronic device.

According to at least one preferred embodiment, a method for performing multi-loop power control in an electronic device, such as an operational method of the above apparatus, is provided. For example, this method such as the operational method of the above apparatus may comprise: utilizing the first amplifier to selectively output the first error signal; utilizing the second amplifier to selectively output the second error signal; and detecting the first PWM signal corresponding to the first error signal and the second PWM signal corresponding to the second error signal to generate the at least one detection result, and dynamically selecting the one of the first PWM signal and the second PWM signal as the resultant PWM signal according to the at least one detection result, to perform power control of the electronic device.

It is an advantage of the present invention that the present invention apparatus and method can reduce the overlap effect (e.g. a non-sharp transition boundary effect) from an overlap between activation time periods of multiple feedback loops within the electronic device, and keep high stability of the electronic device in each of various situations. For example, in a situation where the multiple feedback loops are utilized for performing charging control of a charger within the electronic device indifferent charging phases, respectively, the present invention apparatus and method can reduce the charging time of the charger.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3:
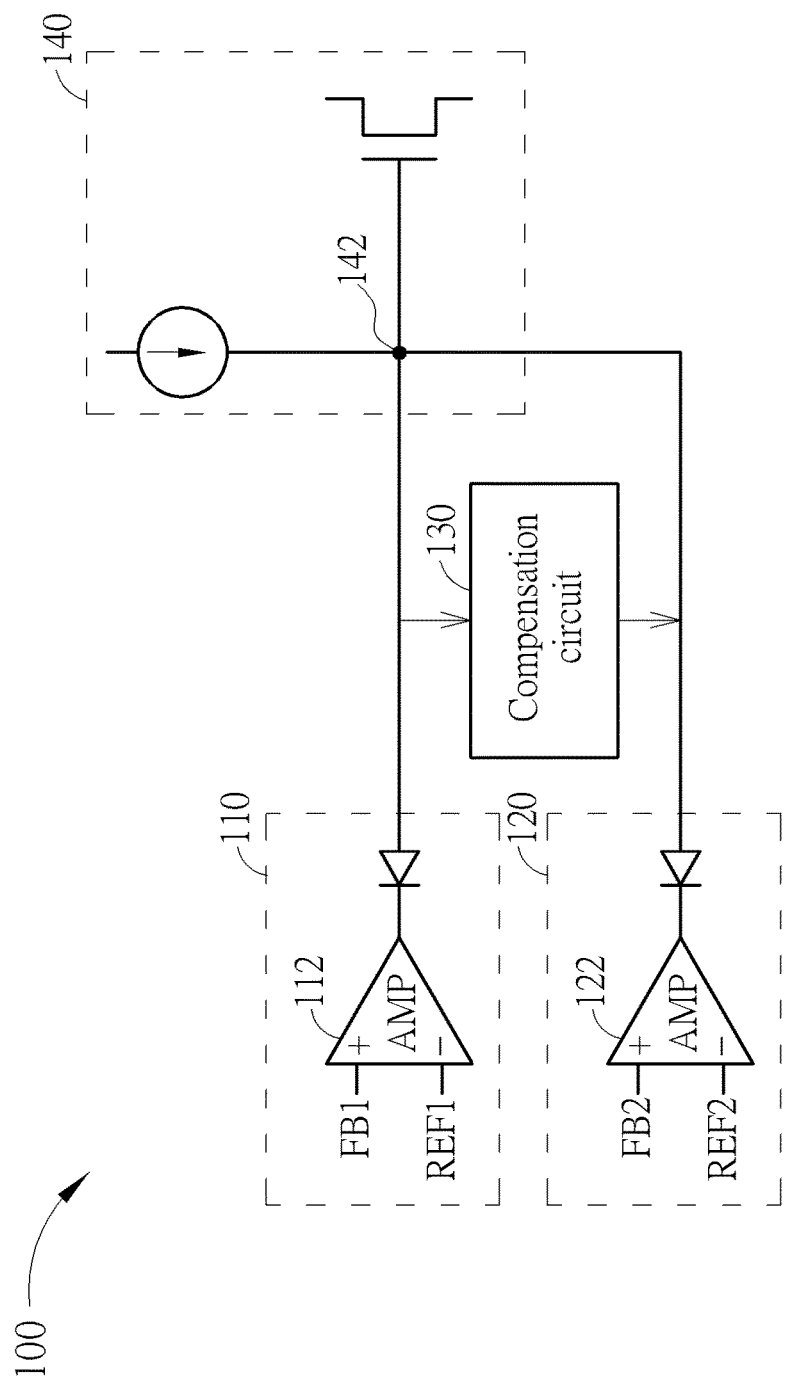
FIG. 3 is a diagram of an apparatus for performing multi-loop power control in an electronic device according to an embodiment of the present invention.

FIG. 3 is a diagram of an apparatus 100 for performing multi-loop power control in an electronic device according to an embodiment of the present invention, where the apparatus 100 may comprise at least one portion of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a multifunctional mobile phone, a tablet, and a laptop computer.

As shown in FIG. 3, the apparatus 100 may comprise a first amplifier 112 (labeled "AMP" in FIG. 1, for brevity) that is positioned in a first feedback loop 110 of the electronic device and coupled to a power control terminal 142 of the electronic device, a second amplifier 122 (labeled "AMP" in FIG. 1, for brevity) that is positioned in a second feedback loop 120 of the electronic device and coupled to the power control terminal 142, and a compensation circuit 130 that is coupled to the first amplifier 112 and the second amplifier 122. For example, the first feedback loop 110 may further comprise a diode coupled between the first amplifier 112 and the power control terminal 142 for controlling the current direction of a current between the first amplifier 112 and the power control terminal 142, and the second feedback loop 120 may further comprise a diode coupled between the second amplifier 122 and the power control terminal 142 for controlling the current direction of a current between the second amplifier 122 and the power control terminal 142. This is for illustrative purposes only, and is not meant to be a limitation of the present invention. In addition, the power control terminal 142 may be positioned in a power control circuit 140 within the electronic device. For example, the power control circuit 140 may comprise a current source coupled to the power control terminal 142, and may comprise a transistor such as a Metal Oxide Semiconductor Field Effect Transistor (MOSFET). This is for illustrative purposes only, and is not meant to be a limitation of the present invention.

According to this embodiment, the first amplifier 112 is arranged for selectively outputting a first error signal toward the power control terminal 142. In addition, the second amplifier 122 is arranged for selectively outputting a second error signal toward the power control terminal 142. Additionally, the compensation circuit 130 is arranged for detecting the first error signal to generate a compensation signal corresponding to the first error signal and applying the compensation signal to the second error signal, to perform power control of the electronic device. For example, the power control terminal 142 may receive the first error signal as a feedback of the first feedback loop 110, to perform power control of the electronic device, and the power control terminal 142 may receive the second error signal as a feedback of the second feedback loop 120, to perform power control of the electronic device.

Figure 1:
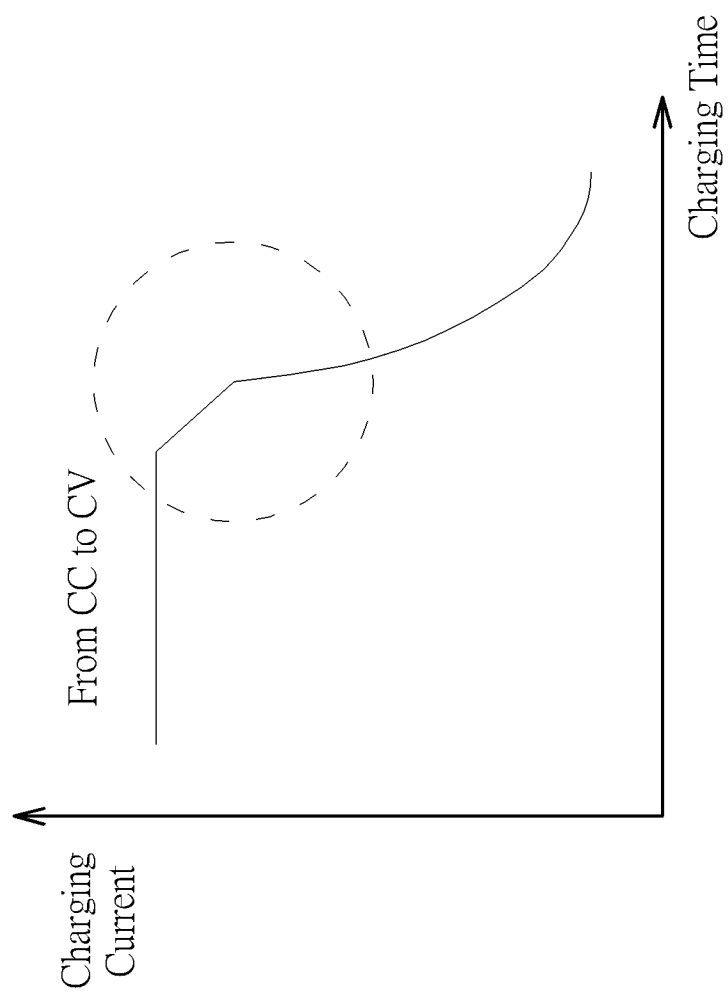
FIG. 1 illustrates an overlap effect from an overlap between activation time periods of multiple feedback loops of a conventional charger system according to the related art.

In the embodiment shown in FIG. 1, the first amplifier 112 may have a first monitoring input terminal (e.g. a positive input terminal labeled "+" in this embodiment) for inputting a first monitoring signal FB1 and a first reference input terminal (e.g. a negative input terminal labeled "−" in this embodiment) for inputting a first reference signal REF1, and the second amplifier 122 may have a second monitoring input terminal (e.g. a positive input terminal labeled "+" in this embodiment) for inputting a second monitoring signal FB2 and a second reference input terminal (e.g. a negative input terminal labeled "−" in this embodiment) for inputting a second reference signal REF2. For example, the electronic device may utilize the first feedback loop 110 to monitor the first monitoring signal FB1 according to the first reference signal REF1, to perform power control of the electronic device. In another example, the electronic device may utilize the second feedback loop 120 to monitor the second monitoring signal FB2 according to the second reference signal REF2, to perform power control of the electronic device.

According to some embodiments, the compensation signal may be equivalent to a product of the first error signal and a predetermined factor, where the predetermined factor is a non-zero factor. For example, the predetermined factor may be equal to 100%. As a result, the strength of the compensation signal may be equal to that of the first error signal. This is for illustrative purposes only, and is not meant to be a limitation of the present invention. In some examples, the predetermined factor may be equal to any other predetermined value.

According to some embodiments, the compensation circuit 130 may apply the compensation signal to the second error signal, to reduce influence of the first feedback loop 110 on the second feedback loop 120 during a time period in which the electronic device switches from power control of the second feedback loop 120 to power control of the first feedback loop 110. For example, the first feedback loop 110 may be utilized for performing charging control in a constant voltage control phase such as the constant voltage (CV) phase mentioned above, and the second feedback loop 120 may be utilized for performing charging control in a constant current control phase such as the constant current (CC) phase mentioned above. When switching from the constant current control phase to the constant voltage control phase, the compensation circuit 130 may apply the compensation signal to the second error signal, to reduce influence of the first feedback loop 110 on the second feedback loop 120 during the time period in which the electronic device switches from the constant current control of the second feedback loop 120 to the constant voltage control of the first feedback loop 110. This is for illustrative purposes only, and is not meant to be a limitation of the present invention. According to some embodiments, the compensation circuit 130 may apply the compensation signal to the second error signal, to remove influence of the first feedback loop 110 on the second feedback loop 120 during the time period in which the electronic device switches from the power control of the second feedback loop 120 to the power control of the first feedback loop 110.

According to some embodiments, the compensation circuit 130 may comprise a detector that is coupled to the first amplifier 112, and may further comprise a compensator that is coupled to the detector and the second amplifier 122. For example, the detector may be arranged for detecting the first error signal to generate a detection signal, and the compensator may be arranged for generating the compensation signal according to the detection signal and applying the compensation signal to the second error signal. This is for illustrative purposes only, and is not meant to be a limitation of the present invention. In some examples, the compensator may be arranged for applying a derivative of the compensation signal to the second error signal.

According to some embodiments, at least one of the first amplifier 112 and the second amplifier 122 (e.g. one of the first amplifier 112 and the second amplifier 122, or each of the first amplifier 112 and the second amplifier 122) may be implemented with various types of circuits. For example, in some of these embodiments, at least one of the first amplifier 112 and the second amplifier 122 (e.g. one of the first amplifier 112 and the second amplifier 122, or each of the first amplifier 112 and the second amplifier 122) may comprise an output transconductance amplifier (OTA), where the OTA may be arranged for converting a voltage difference into a current error signal. In addition, in some of these embodiments, at least one of the first amplifier 112 and the second amplifier 122 (e.g. one of the first amplifier 112 and the second amplifier 122, or each of the first amplifier 112 and the second amplifier 122) may comprise a current source, where this current source may be arranged for converting a current difference into a current error signal. Additionally, in some of these embodiments, at least one of the first amplifier 112 and the second amplifier 122 (e.g. one of the first amplifier 112 and the second amplifier 122, or each of the first amplifier 112 and the second amplifier 122) may comprise an operational amplifier (OPAMP) and a voltage-to-current converter, where the OPAMP may be arranged for converting a voltage difference into a voltage error signal, and the voltage-to-current converter may be arranged for converting the voltage error signal into a current error signal.

According to some embodiments, the apparatus 100 may be applied to various types of power control circuits corresponding to various kinds of scenarios. For example, in some of these embodiments, the power control terminal 142 may be a control terminal of a charger within the electronic device, where the electronic device may selectively utilize the first feedback loop 110 to monitor a voltage of a battery charged by the charger in a constant voltage control phase, and may selectively utilize the second feedback loop 120 to monitor a charging current of the battery in a constant current control phase. In addition, in some of these embodiments, the power control terminal 142 may be a control terminal of a regulating circuit within the electronic device, where the electronic device may selectively utilize the first feedback loop 110 to monitor an output voltage of the regulating circuit, and may selectively utilize the second feedback loop 120 to monitor a current passing through the regulating circuit. Additionally, in some of these embodiments, the power control terminal 142 may be a control terminal of a regulating circuit within the electronic device, where the electronic device may selectively utilize the first feedback loop 110 to monitor an output voltage that the regulating circuit applied to a load, and may selectively utilize the second feedback loop 120 to monitor a current that the regulating circuit draws from a power source of the regulating circuit.

Figure 4:
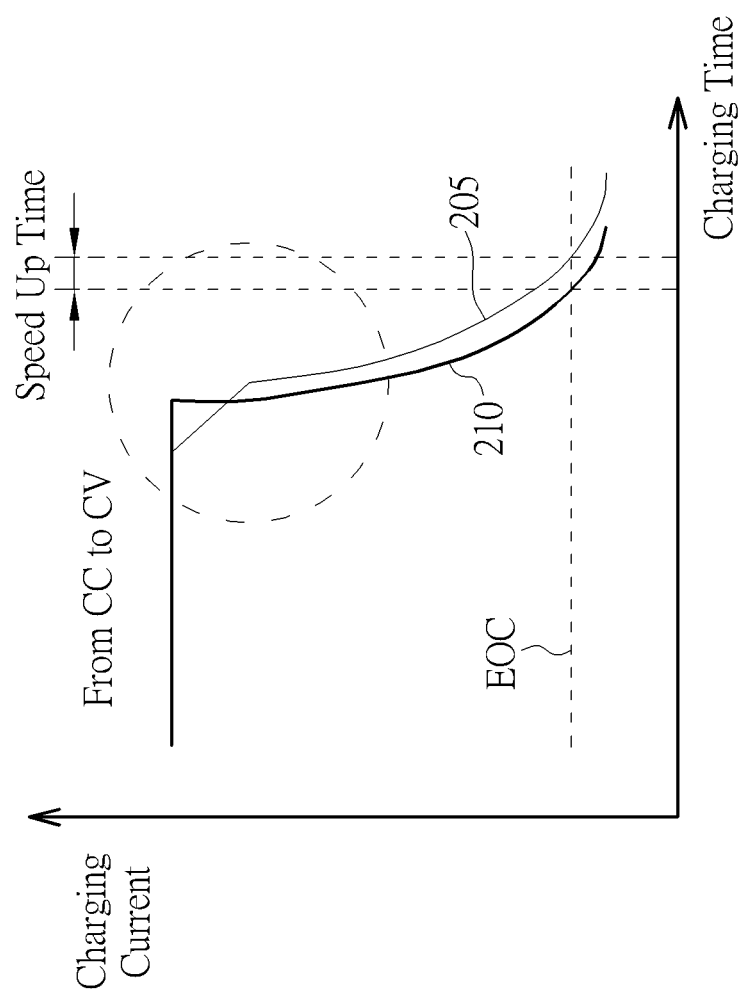
FIG. 4 illustrates overlap effect removal involved with the apparatus shown in FIG. 3 according to an embodiment of the present invention.

FIG. 4 illustrates an overlap effect removal scheme involved with the apparatus 100 shown in FIG. 3 according to an embodiment of the present invention. For example, each of the first amplifier 112 and the second amplifier 122 may comprise an OTA such as that mentioned above. In addition, the power control terminal 142 may be the control terminal of the charger within the electronic device, where the electronic device may selectively utilize the first feedback loop 110 to monitor the voltage of the battery charged by the charger in the constant voltage control phase, and may selectively utilize the second feedback loop 120 to monitor the charging current of the battery in the constant current control phase. Additionally, the relationship between the charging current and the charging time can be expressed with the curve 210.

In comparison with the curve 205 (e.g. the curve shown in FIG. 1), there is a single transition in the curve 210, rather than two transitions, where the single transition corresponds to a sharp boundary at the transition time point. As a result, the overlap effect can be removed. In addition, in comparison with the conventional charger system having the overlap effect shown in FIG. 1, the charging time of the charger of this embodiment is reduced since the overlap effect shown in FIG. 1 is removed. Suppose that the horizontal line EOC represents the end-of-charging current, the speed up time shown in FIG. 4 indicates that the charging time of the charger of this embodiment is shorter.

According to some embodiments, the compensation signal may be intentionally or unintentionally designed to be insufficient for correcting the overlap effect shown in FIG. 1. As a result, the overlap effect removal scheme shown in FIG. 4 becomes an overlap effect reduction scheme in these embodiments. For brevity, similar descriptions for these embodiments are not repeated in detail here.

Figure 5:
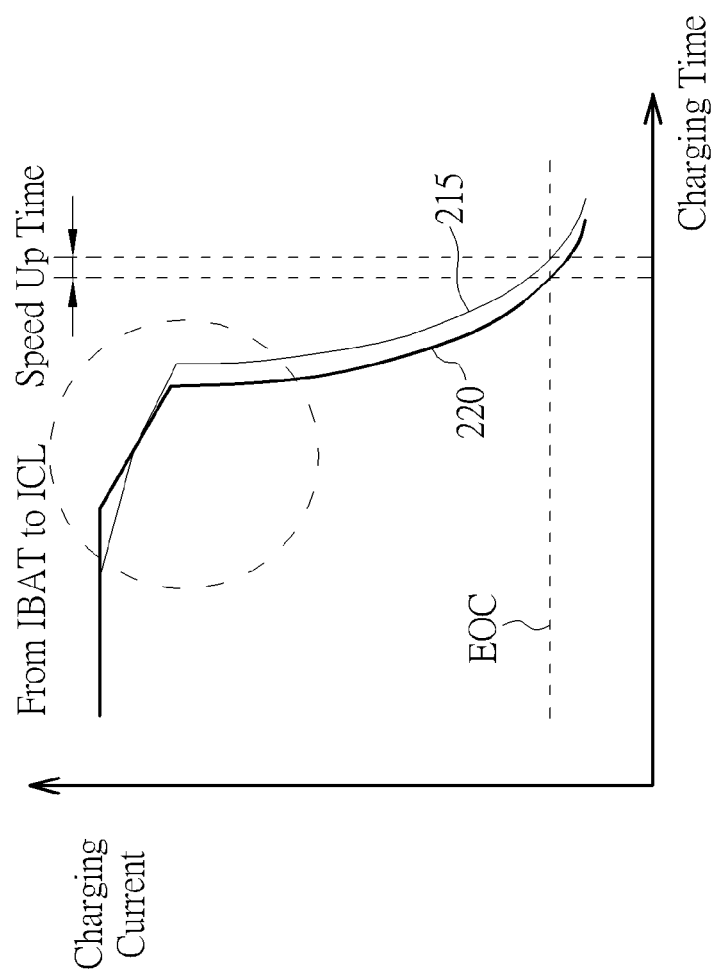
FIG. 5 illustrates overlap effect removal involved with the apparatus shown in FIG. 3 according to another embodiment of the present invention.

FIG. 5 illustrates an overlap effect removal scheme involved with the apparatus 100 shown in FIG. 3 according to another embodiment of the present invention. For example, each of the first amplifier 112 and the second amplifier 122 may comprise an OTA such as that mentioned above. In addition, the power control terminal 142 may be the control terminal of the charger within the electronic device. Additionally, the relationship between the charging current and the charging time can be expressed with the curve 220.

Figure 2:
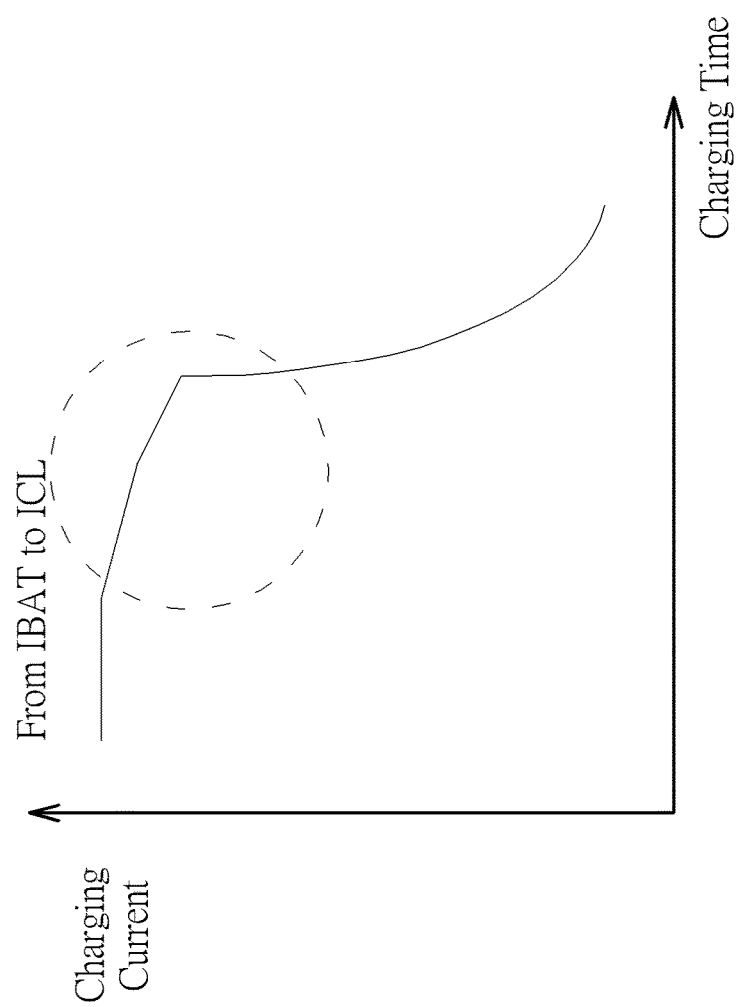
FIG. 2 illustrates another overlap effect from an overlap between activation time periods of multiple feedback loops of a conventional charger system according to the related art.

In comparison with the curve 215 (e.g. the curve shown in FIG. 2), the two transitions are close to each other in the curve 210, rather than being far from each other. As a result, the overlap effect can be removed. In addition, in comparison with the conventional charger system having the overlap effect shown in FIG. 2, the charging time of the charger of this embodiment is reduced since the overlap effect shown in FIG. 2 is removed. Suppose that the horizontal line EOC represents the end-of-charging current, the speed up time shown in FIG. 5 indicates that the charging time of the charger of this embodiment is shorter.

According to some embodiments, the compensation signal may be intentionally or unintentionally designed to be insufficient for correcting the overlap effect shown in FIG. 2. As a result, the overlap effect removal scheme shown in FIG. 5 becomes an overlap effect reduction scheme in these embodiments. For brevity, similar descriptions for these embodiments are not repeated in detail here.

Figure 6:
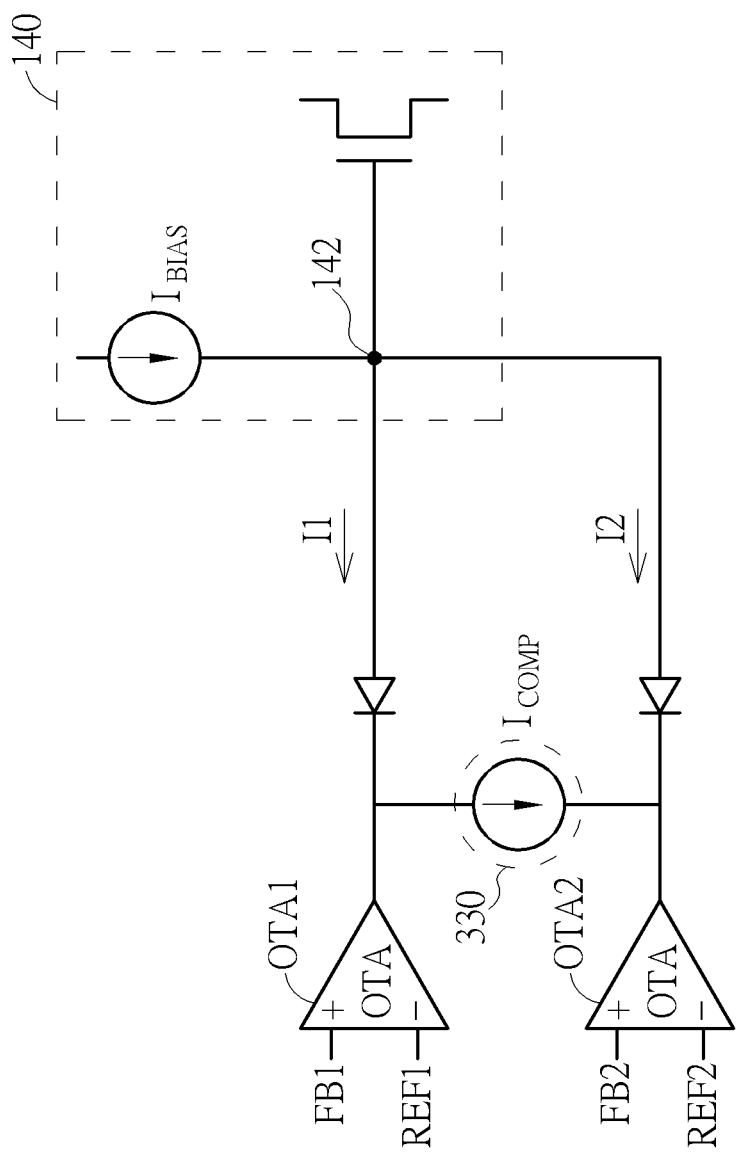
FIG. 6 illustrates a control scheme involved with the apparatus shown in FIG. 3 according to an embodiment of the present invention.

FIG. 6 illustrates a control scheme involved with the apparatus 100 shown in FIG. 3 according to an embodiment of the present invention. For example, each of the first amplifier 112 and the second amplifier 122 may comprise an OTA such as that mentioned above. More particularly, the first amplifier 112 can be implemented with an OTA OTA1, and the second amplifier 122 can be implemented with an OTA OTA2. In addition, the compensation circuit 130 may comprise a current source 330 generating a compensation current $I_{COMP}$ corresponding to the detection signal mentioned above, where the compensation current $I_{COMP}$ can be taken as an example of the compensation signal mentioned above, the current I1 can be taken as an example of the first error signal, and the current I2 can be taken as an example of the second error signal. For example, the current $I_{BIAS}$ of the current source in the power control circuit 140 may be equal to the summation of the current I1 corresponding to the first feedback loop 110 and the current I2 corresponding to the second feedback loop 120. Additionally, the power control terminal 142 may be the control terminal of the charger within the electronic device.

According to this embodiment, the apparatus 100 may control the compensation current $I_{COMP}$ to be equal to the current I1, to make the output current of the OTA OTA2 be equal to the current $I_{BIAS}$, thereby the overlap effect can be removed. For brevity, similar descriptions for this embodiment are not repeated in detail here.

Figure 7:
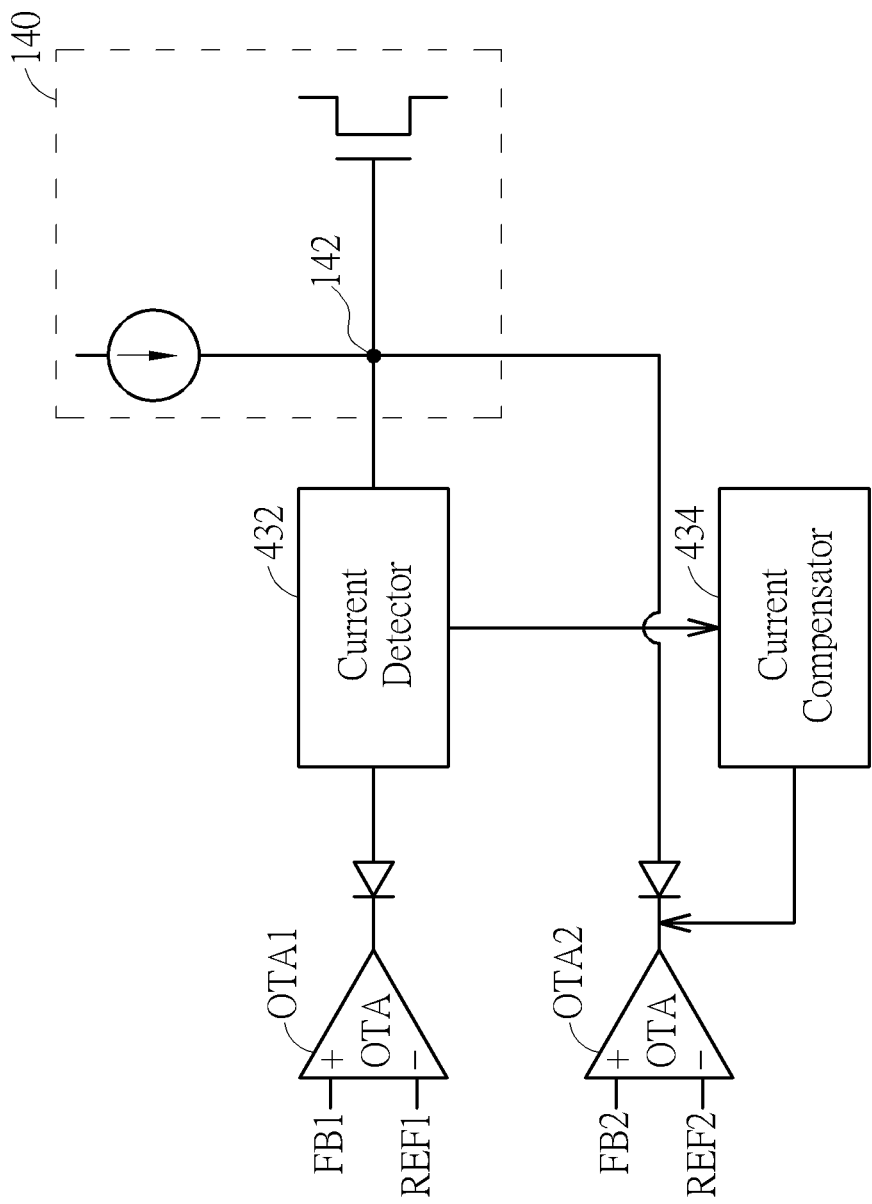
FIG. 7 illustrates a control scheme involved with the apparatus shown in FIG. 3 according to another embodiment of the present invention.

FIG. 7 illustrates a control scheme involved with the apparatus 100 shown in FIG. 3 according to another embodiment of the present invention. For example, each of the first amplifier 112 and the second amplifier 122 may comprise an OTA such as that mentioned above. More particularly, the first amplifier 112 can be implemented with the OTA OTA1, and the second amplifier 122 can be implemented with the OTA OTA2. In addition, the current detector 432 and the current compensator can be taken as examples of the detector and the compensator mentioned in some embodiments described above, respectively. Additionally, the power control terminal 142 may be the control terminal of the charger within the electronic device. For brevity, similar descriptions for this embodiment are not repeated in detail here.

Figure 8:
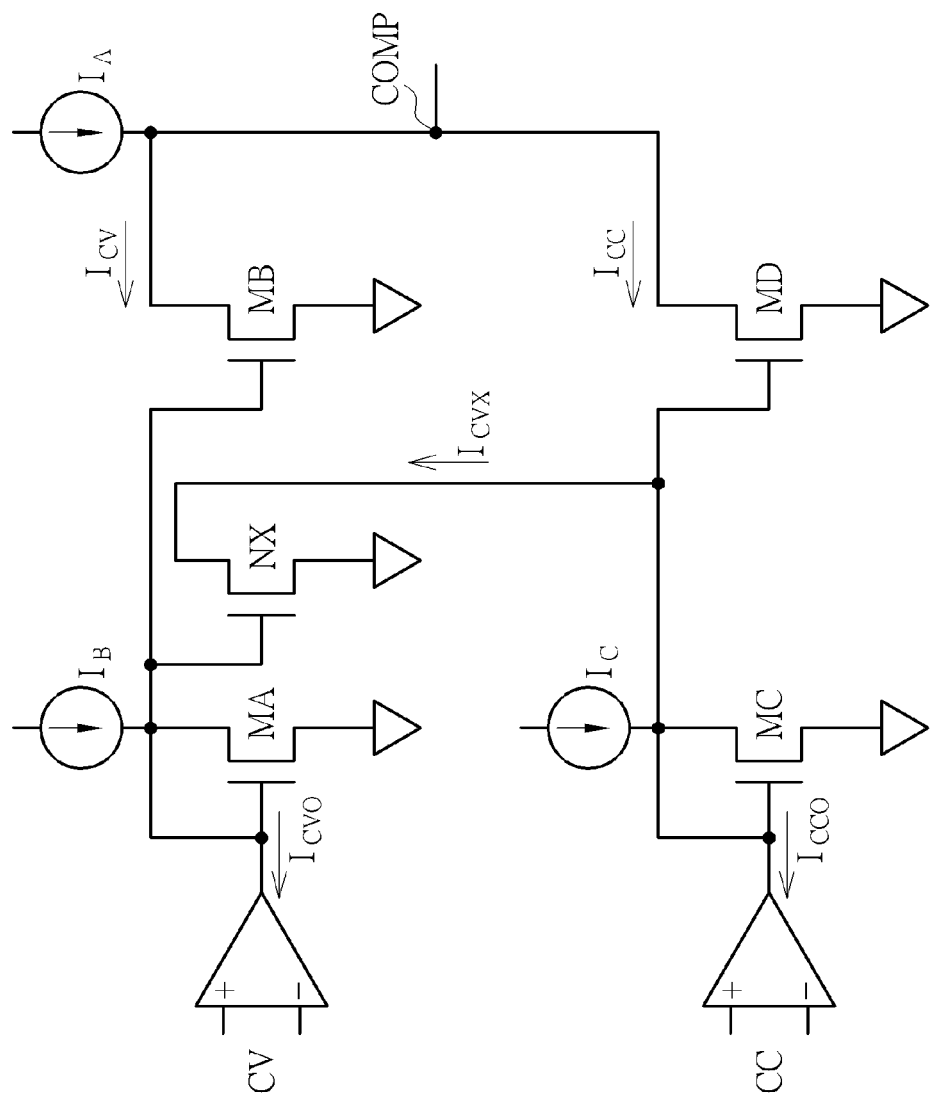
FIG. 8 illustrates a control scheme involved with the apparatus shown in FIG. 3 according to another embodiment of the present invention.

FIG. 8 illustrates a control scheme involved with the apparatus 100 shown in FIG. 3 according to another embodiment of the present invention. For example, each of the first amplifier 112 and the second amplifier 122 may comprise an OPAMP such as that mentioned above. More particularly, the first amplifier 112 can be implemented with an OPAMP shown around the upper left corner of FIG. 8, where the notation "CV" indicates that the first feedback loop 110 comprising this OPAMP can be utilized for performing charging control in the constant voltage control phase such as the constant voltage (CV) phase mentioned above. In addition, the second amplifier 122 can be implemented with an OPAMP shown around the lower left corner of FIG. 8, where the notation "CC" indicates that the second feedback loop 120 comprising this OPAMP can be utilized for performing charging control in the constant current control phase such as the constant current (CC) phase mentioned above.

As shown in FIG. 8, the compensation circuit 130 may comprise some transistors such as the MOSFETs MA, MB, MC, MD, and NX, and may further comprises some current sources generating the currents $I_A$, $I_B$, and $I_C$, respectively. For better comprehension, some associated currents $I_{CV}$, $I_{CC}$, $I_{CVO}$, $I_{CCO}$, and $I_{CVX}$ are illustrated, where the current $I_{CVX}$ can be taken as an example of the compensation signal mentioned above, the current $I_{CVO}$ can be taken as an example of the first error signal, and the current $I_{CCO}$ can be taken as an example of the second error signal. For example, the current $I_A$ of the current source shown around the upper right corner of FIG. 8 may be equal to the summation of the current $I_{CV}$ corresponding to the first feedback loop 110 and the current $I_{CC}$ corresponding to the second feedback loop 120. Additionally, the terminal COMP can be taken as an example of the power control terminal 142. For brevity, similar descriptions for this embodiment are not repeated in detail here.

According some embodiments, such as the embodiment shown in FIG. 1 and the subsequent embodiments thereof, a method for performing multi-loop power control in an electronic device, such as an operational method of the apparatus 100 shown in FIG. 1, is provided. For example, this method such as the operational method of the apparatus 100 may comprise: utilizing the first amplifier 112 to selectively output the first error signal toward the power control terminal 142; utilizing the second amplifier 122 to selectively output the second error signal toward the power control terminal 142; and applying the compensation signal corresponding to the first error signal to the second error signal, to perform power control of the electronic device. It is an advantage of the present invention that the apparatus 600 and the method thereof can reduce the overlap effect (e.g. the non-sharp transition boundary effect) from an overlap between activation time periods of multiple feedback loops within the electronic device. For brevity, similar descriptions for these embodiments are not repeated in detail here.

Figure 9:
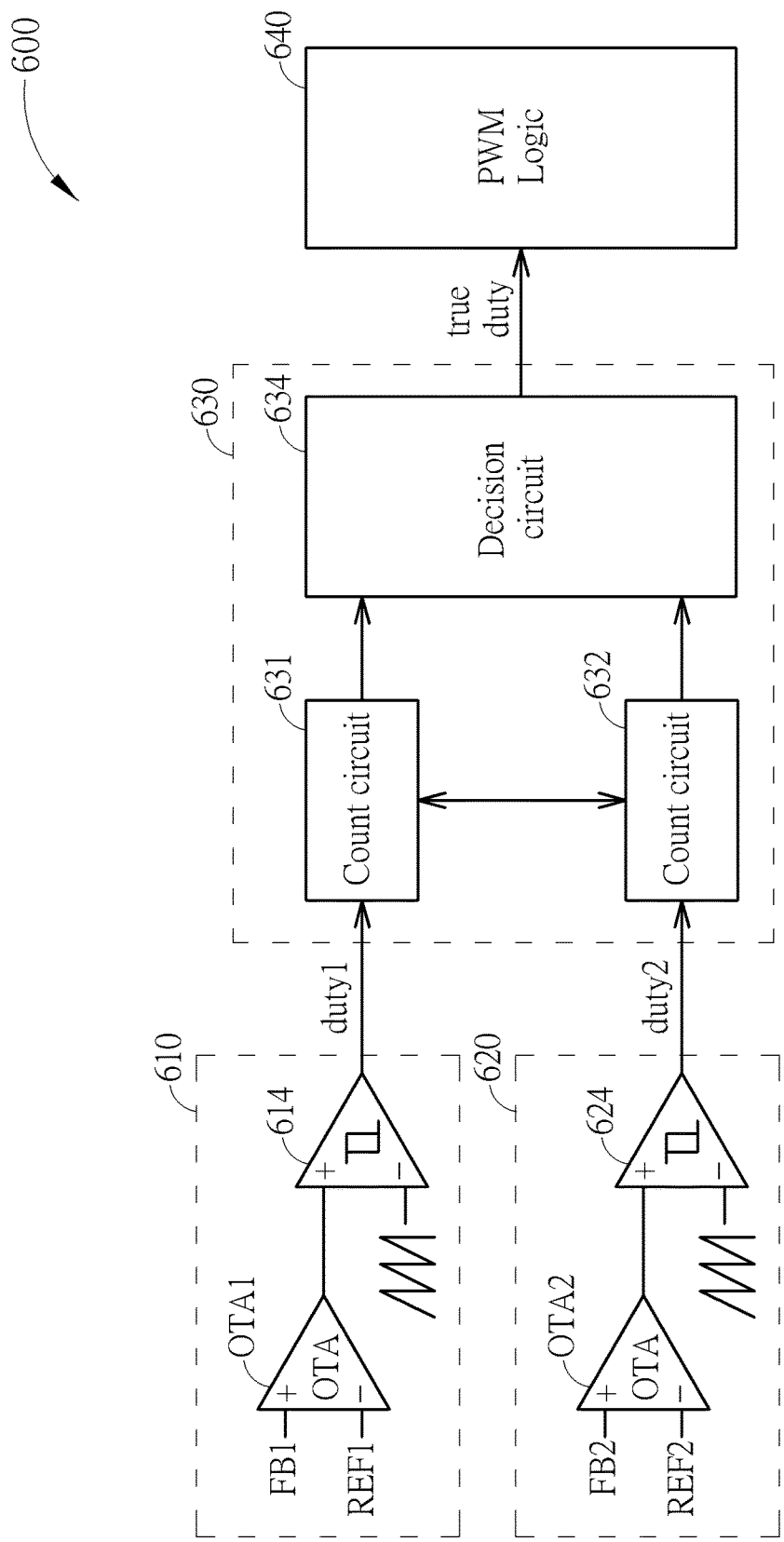
FIG. 9 is a diagram of an apparatus for performing multi-loop power control in an electronic device according to another embodiment of the present invention.

FIG. 9 is a diagram of an apparatus 600 for performing multi-loop power control in an electronic device (e.g. the electronic device mentioned in the embodiment shown in FIG. 1) according to another embodiment of the present invention, where the apparatus 600 may comprise at least one portion of this electronic device. For example, the apparatus 600 may comprise a portion of the electronic device mentioned above, and more particularly, can be at least one hardware circuit such as at least one IC within the electronic device and associated circuits thereof. In another example, the apparatus 600 can be the whole of the electronic device mentioned above. In another example, the apparatus 600 may comprise a system comprising the electronic device mentioned above (e.g. a wireless communications system comprising the electronic device). Examples of the electronic device may include, but not limited to, a multifunctional mobile phone, a tablet, and a laptop computer.

According to this embodiment, the apparatus 600 may comprise a first amplifier that is positioned in a first feedback loop 610 of the electronic device, such as the first amplifier 112 positioned in the first feedback loop 110, and may further comprise a second amplifier that is positioned in a second feedback loop 620 of the electronic device, such as the second amplifier 122 positioned in the second feedback loop 120. However, it is unnecessary that the first amplifier and the second amplifier of the apparatus 600 are coupled to a power control terminal such as the power control terminal 142. As shown in FIG. 9, the apparatus 600 may comprise the OTA OTA1 and a comparator 614 that are positioned in the first feedback loop 610, and may comprise the OTA OTA2 and a comparator 624 that are positioned in the second feedback loop 620, where the OTA OTA1 can be taken as an example of the first amplifier of the apparatus 600, and the OTA OTA2 can be taken as an example of the second amplifier of the apparatus 600. In addition, the apparatus 600 may further comprise a selection control circuit 630 that is coupled to the first amplifier and the second amplifier of the apparatus 600 (more particularly, coupled to the OTAs OTA1 and OTA2 through the comparators 614 and 624, respectively), and a pulse width modulation (PWM) logic 640 (which can also be referred to as the PWM logic circuit). Additionally, the selection control circuit 630 may comprise a plurality of count circuits such as two count circuits 631 and 632, and may further comprise a decision circuit 634 that is coupled to the plurality of count circuits such as the two count circuits 631 and 632.

The first amplifier of the apparatus 600 (e.g. the OTA OTA1) may be arranged for selectively outputting a first error signal such as that mentioned above, and the second amplifier of the apparatus 600 (e.g. the OTA OTA2) may be arranged for selectively outputting a second error signal such as that mentioned above. For example, the comparator 614 may compare the first error signal with a first periodic ramp signal to generate a first PWM signal duty1 corresponding to the first error signal, and the comparator 624 may compare the second error signal with a second periodic ramp signal to generate a second PWM signal duty2 corresponding to the second error signal. For better comprehension the first periodic ramp signal and the second periodic ramp signal are illustrated with some ramp waveforms, respectively. As shown in FIG. 9, the selection control circuit 130 is arranged for detecting the first PWM signal duty1 and the second PWM signal duty2 to generate at least one detection result, and dynamically selecting one of the first PWM signal duty1 and the second PWM signal duty2 as a resultant PWM signal (labeled "true duty" in FIG. 9, for better comprehension) according to the aforementioned at least one detection result, to perform power control of the electronic device.

For example, the count circuits 631 and 632 may count the first PWM signal duty1 and the second PWM signal duty2 to generate a first count result and a second count result, respectively, where the aforementioned at least one detection result may comprise the first count result and the second count result (e.g. the first count result and the second count result can be taken as examples of the aforementioned at least one detection result). According to the first count result and the second count result, the decision circuit 634 may determine whether one pulse within a pulse of the first PWM signal duty1 and a pulse of the second PWM signal duty2 appears earlier than another pulse within the pulse of the first PWM signal duty1 and the pulse of the second PWM signal duty2, in order to dynamically select the aforementioned one of the first PWM signal duty1 and the second PWM signal duty2 as the resultant PWM signal. As a result, the PWM logic 640 may perform power control according to the resultant PWM signal that is dynamically selected from the first PWM signal duty1 and the second PWM signal duty2 by the selection control circuit 130.

According to some embodiments, the selection control circuit 630 may monitor a first duty cycle of the first PWM signal duty1 and a second duty cycle of the second PWM signal duty2, respectively, to generate the aforementioned at least one detection result. For example, the aforementioned at least one detection result may comprise statistics data, such as the statistics data related to at least one of the first duty cycle and the second duty cycle.

Figure 10:
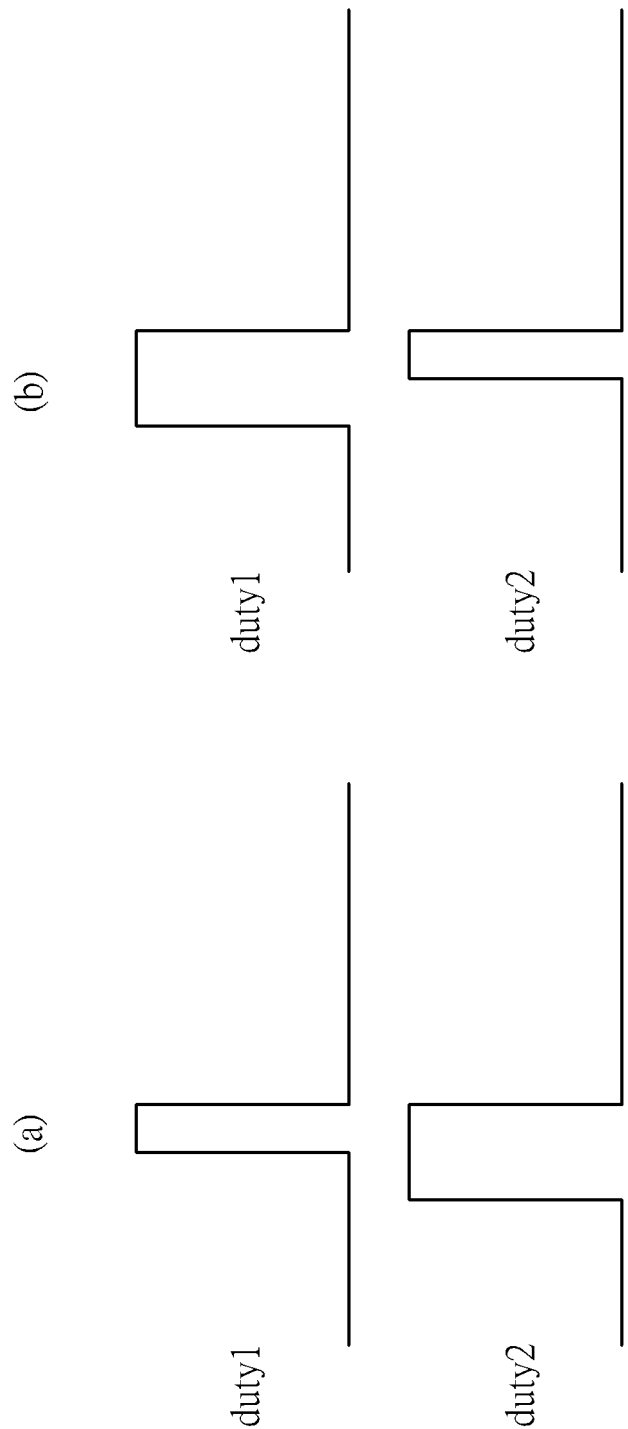
FIG. 10 illustrates a control scheme involved with the apparatus shown in FIG. 9 according to an embodiment of the present invention.

FIG. 10 illustrates a control scheme involved with the apparatus 600 shown in FIG. 9 according to an embodiment of the present invention. In a situation (a) where the rising edge of the pulse of the second PWM signal duty2 appears earlier than the rising edge of the pulse of the first PWM signal duty1, the decision circuit 634 may determine that the pulse of the second PWM signal duty2 appears earlier than the pulse of the first PWM signal duty1. In a situation (b) where the rising edge of the pulse of the first PWM signal duty1 appears earlier than the rising edge of the pulse of the second PWM signal duty2, the decision circuit 634 may determine that the pulse of the first PWM signal duty1 appears earlier than the pulse of the second PWM signal duty2. Please note that multiple pulses of the first PWM signal duty1 and multiple pulses of the second PWM signal duty2 may be detected at different time points, and the first count result and the second count result may be respectively updated (more particularly, increased) as time goes by, and therefore, the decision circuit 634 may detect different situations such as those shown in FIG. 10 at different time points, respectively. For example, based on whether the situations (a) or (b) are detected and/or the occurrence patterns of the situations (a) and (b), the decision circuit 634 may dynamically select the aforementioned one of the first PWM signal duty1 and the second PWM signal duty2 as the resultant PWM signal.

According some embodiments, the statistics data may comprise whether one situation within the situations (a) and (b) has been continuously detected for A1 times, where the notation may represent a positive integer. For example, the first PWM signal duty1 is originally selected as the resultant PWM signal by the decision circuit 634 at a time point. When the situation (a) has been continuously detected for A1 times, the decision circuit 634 may select the second PWM signal duty2 as the resultant PWM signal at another time point. In another example, the second PWM signal duty2 is originally selected as the resultant PWM signal by the decision circuit 634 at a time point. When the situation (b) has been continuously detected for A1 times, the decision circuit 634 may select the first PWM signal duty1 as the resultant PWM signal at another time point. This is for illustrative purposes only, and is not meant to be a limitation of the present invention. According some embodiments, it is unnecessary that whether the situation (a) has been continuously detected for A1 times and whether the situation (b) has been continuously detected for A1 times should be determined. According some embodiments, the statistics data may comprise whether the occurrence pattern of the situation (a) complies with a predetermined pattern and/or whether the occurrence pattern of the situation (b) complies with a predetermined pattern.

According some embodiments, suppose that the notation "N2" represents a positive value that is less than or equal to one, and that the summation of the number of occurrence of the situation (a) and the number of occurrence of the situation (b) is equal to A2, where the notation "A2" may represent a positive integer. For example, the first PWM signal duty1 is originally selected as the resultant PWM signal by the decision circuit 634 at a time point. During the A2 times detections, when the situation (a) has been detected for (N2*A2) times, the decision circuit 634 may select the second PWM signal duty2 as the resultant PWM signal at another time point. In another example, the second PWM signal duty2 is originally selected as the resultant PWM signal by the decision circuit 634 at a time point. During the A2 times detections, when the situation (b) has been detected for (N2*A2) times, the decision circuit 634 may select the first PWM signal duty1 as the resultant PWM signal at another time point. This is for illustrative purposes only, and is not meant to be a limitation of the present invention.

According some embodiments, suppose that the summation of the number of occurrence of the situation (a) and the number of occurrence of the situation (b) is equal to A3, where the notation "A3" may represent a positive integer. For example, no matter whether the first PWM signal duty1 or the second PWM signal duty2 is originally selected as the resultant PWM signal by the decision circuit 634 at a time point, during the A3 times detections, when the situation (a) has been detected for over (50%*A3) times (e.g. for N3 times, where A3>N3>(50%*A3)), the decision circuit 634 may select the second PWM signal duty2 as the resultant PWM signal at another time point. In another example, no matter whether the first PWM signal duty1 or the second PWM signal duty2 is originally selected as the resultant PWM signal by the decision circuit 634 at a time point, during the A3 times detections, when the situation (b) has been detected for over (50%*A3) times (e.g. for N4 times, where A4>N4>(50%*A3)), the decision circuit 634 may select the first PWM signal duty1 as the resultant PWM signal at another time point. This is for illustrative purposes only, and is not meant to be a limitation of the present invention. According some embodiments, the percentage of 50% in the aforementioned (50%*A3) times may vary. For example, the percentage of 50% may be increased. In another example, the percentage of 50% may be replaced by 100%. According some embodiments, the percentage of 50% in the aforementioned (50%*A3) times may be replaced by a predetermined programmable ratio.

According some embodiments, such as the embodiment shown in FIG. 9 and the subsequent embodiments thereof, a method for performing multi-loop power control in an electronic device, such as an operational method of the apparatus 600 shown in FIG. 9, is provided. For example, this method such as the operational method of the apparatus 600 may comprise: utilizing the first amplifier to selectively output the first error signal; utilizing the second amplifier to selectively output the second error signal; and detecting the first PWM signal duty1 corresponding to the first error signal and the second PWM signal duty2 corresponding to the second error signal to generate the at least one detection result, and dynamically selecting the one of the first PWM signal duty1 and the second PWM signal duty2 as the resultant PWM signal according to the at least one detection result, to perform power control of the electronic device. It is an advantage of the present invention that the apparatus 600 and the method thereof can keep high stability of the electronic device in each of various situations. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing multi-loop power control in an electronic device, the apparatus comprising:
    a first amplifier, positioned in a first feedback loop of the electronic device and coupled to a power control terminal of the electronic device, arranged for selectively outputting a first error signal toward the power control terminal;
    a second amplifier, positioned in a second feedback loop of the electronic device and coupled to the power control terminal, arranged for selectively outputting a second error signal toward the power control terminal; and
    a compensation circuit, coupled to the first amplifier and the second amplifier, arranged for detecting the first error signal to generate a compensation signal corresponding to the first error signal and applying the compensation signal to the second error signal, to perform power control of the electronic device.

2. The apparatus of claim 1, wherein the first amplifier has a first monitoring input terminal for inputting a first monitoring signal and a first reference input terminal for inputting a first reference signal, and the second amplifier has a second monitoring input terminal for inputting a second monitoring signal and a second reference input terminal for inputting a second reference signal.

3. The apparatus of claim 2, wherein the electronic device utilizes the first feedback loop to monitor the first monitoring signal according to the first reference signal, to perform power control of the electronic device.

4. The apparatus of claim 2, wherein the electronic device utilizes the second feedback loop to monitor the second monitoring signal according to the second reference signal, to perform power control of the electronic device.

5. The apparatus of claim 1, wherein the power control terminal receives the first error signal as a feedback of the first feedback loop, to perform power control of the electronic device; and the power control terminal receives the second error signal as a feedback of the second feedback loop, to perform power control of the electronic device.

6. The apparatus of claim 1, wherein the compensation signal is equivalent to a product of the first error signal and a predetermined factor, wherein the predetermined factor is a non-zero factor.

7. The apparatus of claim 1, wherein the compensation circuit applies the compensation signal to the second error signal, to reduce influence of the first feedback loop on the second feedback loop during a time period in which the electronic device switches from power control of the second feedback loop to power control of the first feedback loop.

8. The apparatus of claim 1, wherein the compensation circuit comprises:
a detector, coupled to the first amplifier, arranged for detecting the first error signal to generate a detection signal; and
a compensator, coupled to the detector and the second amplifier, arranged for generating the compensation signal according to the detection signal and applying the compensation signal or a derivative thereof to the second error signal.

9. The apparatus of claim 1, wherein at least one of the first amplifier and the second amplifier comprises:
an output transconductance amplifier (OTA), arranged for converting a voltage difference into a current error signal.

10. The apparatus of claim 1, wherein at least one of the first amplifier and the second amplifier comprises:
a current source, arranged for converting a current difference into a current error signal.

11. The apparatus of claim 1, wherein at least one of the first amplifier and the second amplifier comprises:
an operational amplifier (OPAMP), arranged for converting a voltage difference into a voltage error signal; and
a voltage-to-current converter, arranged for converting the voltage error signal into a current error signal.

12. The apparatus of claim 1, wherein the power control terminal is a control terminal of a charger within the electronic device; and the electronic device selectively utilizes the first feedback loop to monitor a voltage of a battery charged by the charger in a constant voltage control phase, and selectively utilizes the second feedback loop to monitor a charging current of the battery in a constant current control phase.

13. The apparatus of claim 1, wherein the power control terminal is a control terminal of a regulating circuit within the electronic device; and the electronic device selectively utilizes the first feedback loop to monitor an output voltage of the regulating circuit, and selectively utilizes the second feedback loop to monitor a current passing through the regulating circuit.

14. The apparatus of claim 1, wherein the power control terminal is a control terminal of a regulating circuit within the electronic device; and the electronic device selectively utilizes the first feedback loop to monitor an output voltage that the regulating circuit applied to a load, and selectively utilizes the second feedback loop to monitor a current that the regulating circuit draws from a power source of the regulating circuit.

15. An operational method of the apparatus of claim 1, wherein the operational method comprises:
utilizing the first amplifier to selectively output the first error signal toward the power control terminal;
utilizing the second amplifier to selectively output the second error signal toward the power control terminal; and
applying the compensation signal corresponding to the first error signal to the second error signal, to perform power control of the electronic device.

16. An apparatus for performing multi-loop power control in an electronic device, the apparatus comprising:
a first amplifier, positioned in a first feedback loop of the electronic device, arranged for selectively outputting a first error signal;
a second amplifier, positioned in a second feedback loop of the electronic device, arranged for selectively outputting a second error signal; and
a selection control circuit, coupled to the first amplifier and the second amplifier, arranged for detecting a first pulse width modulation (PWM) signal corresponding to the first error signal and a second PWM signal corresponding to the second error signal to generate at least one detection result, and dynamically selecting one of the first PWM signal and the second PWM signal as a resultant PWM signal according to the at least one detection result, to perform power control of the electronic device.

17. The apparatus of claim. 16, wherein the selection control circuit monitors a first duty cycle of the first PWM signal and a second duty cycle of the second PWM signal, respectively, to generate the at least one detection result.

18. The apparatus of claim 17, wherein the at least one detection result comprises statistics data, the statistics data related to at least one of the first duty cycle and the second duty cycle.

19. The apparatus of claim 16, wherein the selection control circuit comprises:
a plurality of count circuits, arranged for counting the first PWM signal and the second PWM signal to generate a first count result and a second count result, respectively, wherein the at least one detection result comprises the first count result and the second count result; and
a decision circuit, coupled to the plurality of count circuits, arranged for determining, according to the first count result and the second count result, whether one pulse within a pulse of the first PWM signal and a pulse of the second PWM signal appears earlier than another pulse within the pulse of the first PWM signal and the pulse of the second PWM signal, in order to dynamically select the one of the first PWM signal and the second PWM signal as the resultant PWM signal.

20. An operational method of the apparatus of claim 16, wherein the operational method comprises:
utilizing the first amplifier to selectively output the first error signal;
utilizing the second amplifier to selectively output the second error signal; and
detecting the first PWM signal corresponding to the first error signal and the second PWM signal corresponding to the second error signal to generate the at least one detection result, and dynamically selecting the one of the first PWM signal and the second PWM signal as the resultant PWM signal according to the at least one detection result, to perform power control of the electronic device.

* * * * *